(12) United States Patent
Barnett

(10) Patent No.: US 6,988,231 B2
(45) Date of Patent: Jan. 17, 2006

(54) ON-CHIP METHOD AND APPARATUS FOR TESTING SEMICONDUCTOR CIRCUITS

(75) Inventor: Philip C. Barnett, Clanfield (GB)

(73) Assignees: Emosyn America, Inc., Sunnyvale, CA (US); EM Microelectric-Marin SA, Marin (CH)

( * ) Notice: Subject to any disclaimer, the term of this patent is extended or adjusted under 35 U.S.C. 154(b) by 624 days.

(21) Appl. No.: 09/809,897

(22) Filed: Mar. 16, 2001

(65) Prior Publication Data

US 2002/0133771 A1 Sep. 19, 2002

(51) Int. Cl.
*G01R 31/28* (2006.01)
*G06F 11/00* (2006.01)

(52) U.S. Cl. .......................................... 714/733; 714/31
(58) Field of Classification Search ................. 714/733, 714/724, 725, 734, 735, 741, 718, 719, 819, 714/824, 31, 37, 38, 39, 30, 42, 45, 736, 714/54; 365/201
See application file for complete search history.

(56) References Cited

U.S. PATENT DOCUMENTS

| | | | |
|---|---|---|---|
| 5,399,505 A | | 3/1995 | Dasse et al. |
| 6,182,257 B1 | * | 1/2001 | Gillingham ................. 714/733 |
| 6,189,121 B1 | | 2/2001 | Ogawa |
| 6,230,290 B1 | | 5/2001 | Heidel et al. |
| 6,321,320 B1 | * | 11/2001 | Fleischman et al. ........ 711/217 |
| 6,622,269 B1 | * | 9/2003 | Ngo et al. .................. 714/718 |

OTHER PUBLICATIONS

Kat7000System Specification Manual, Issue 1: Jul. 1993, K.A.T. Technologies Ltd., pp. 1–15.

* cited by examiner

*Primary Examiner*—Christine T. Tu
(74) *Attorney, Agent, or Firm*—Kevin M. Mason; Ryan, Mason & Lewis, LLP

(57) ABSTRACT

A semiconductor circuit is disclosed that contains test hardware or test software (or both) that allows test functions to be executed directly from the memory of the semiconductor circuit. A remote testing station can issue a command indicating a specific test function that should be implemented. The disclosed semiconductor circuit independently performs the indicated test and provides the results to the test station. For an exemplary memory test, the test hardware and test software are employed to initially clear the memory and thereafter selectively apply a pattern to memory and read the applied pattern from each address to confirm that the correct pattern has been stored. The testing technique of the present invention reduces the number of pins that must be contacted by the tester, such as the address pins. In addition, the reduced number of contact points allows a number of semiconductor circuits to be setup and tested in parallel using the same automated test equipment (ATE).

18 Claims, 6 Drawing Sheets

ON-CHIP METHOD AND APPARATUS FOR TESTING SEMICONDUCTOR CIRCUITS

FIELD OF THE INVENTION

The present invention relates generally to a method and apparatus for testing semiconductor circuits, such as microprocessors and microcontrollers, and more particularly, to a method and apparatus for testing such semiconductor circuits using features and functions provided on the semiconductor circuit itself.

BACKGROUND OF THE INVENTION

The design, testing and fabrication of semiconductor circuits, such as microprocessors and microcontrollers, is often an expensive and time-consuming process. Several types of computer aided design (CAD) tools have been developed or proposed to facilitate the design and fabrication of integrated circuits. Generally, semiconductor circuits are tested following fabrication using automated test equipment (ATE).

Automated test equipment (ATE) is computer controlled test and measurement equipment arranged in a manner to automatically test a semiconductor circuit. Automated test equipment (ATE) provides predictable and repeatable testing, and generally allows the high cost of test equipment to be amortized over a high volume of semiconductor circuits that are tested. Automated test equipment (ATE) may perform limited testing of a semiconductor circuit without applying power to the semiconductor circuit being tested, to identify several common manufacturing defects, such as incorrect or missing components, and opens and shorts. Opens and shorts, for example, may be detected using well-known continuity testing techniques. In addition, once the semiconductor circuit is powered up, the automated test equipment (ATE) can functionally test the semiconductor circuit to evaluate the proper performance of a semiconductor circuit. Functional testers apply power and other required signals to the semiconductor circuit and test the semiconductor circuit using its external inputs and outputs. The testing of semiconductor circuits in this manner helps to ensure that a given semiconductor circuit will operate properly in its intended environment.

Manufacturing yields, as well as the time and expense required to test such semiconductor circuit devices, contribute to the fabrication costs associated with such devices. Since the costs associated with the automated test equipment (ATE) are amortized over all of the semiconductor circuits that are tested by the automated test equipment (ATE), the testing-related costs allocated to a given semiconductor circuit are proportional to the time required to test each semiconductor circuit. In addition, as the complexity of a given semiconductor circuit design increases, there is generally a corresponding increase in the complexity and cost of the required automated test equipment (ATE). Thus, the performance of the automated test equipment (ATE) needs to be continuously upgraded to maintain pace with the increasing speed, complexity or other performance requirements of the semiconductor circuits themselves. Specifically, automated test equipment (ATE) must constantly evolve, to provide higher performance, and increased functionality, throughput and accuracy.

Another factor that contributes to the efficiency and amortized cost of automated test equipment (ATE) is the number of pins on a semiconductor circuit that must be accessed by the automated test equipment (ATE) in order to perform functional testing. FIG. 1 illustrates a conventional tester 100 having a probe head 110 that interfaces with the pins or pads on each integrated circuit of a wafer 150. A typical semiconductor circuit has an increasing number of pins, including pins for voltage, ground, serial port, clock, reset, address and spares. In addition, since the number of address pins is proportional to memory size, the number of address pins required to fully test the memory increases in a like manner with the size of the required memory. There is a physical limitation on the number of pins that can reasonably be accessed by conventional automated test equipment (ATE). Thus, conventional automated test equipment (ATE) can only test a single semiconductor circuit at a time.

FIGS. 2A and 2B illustrate the serial testing of a particular semiconductor circuit 210-a and 210-b, respectively, on the wafer 150 by the tester 100 of FIG. 1. The serial nature of the testing in turn impacts the amortized cost that is allocated to each semiconductor circuit. As shown in FIGS. 2A and 2B, the probe head 110 is moved from semiconductor circuit 210-a to semiconductor circuit 210-b in a serial manner, performing the same tests on each semiconductor circuit. The limitation is on the number of probes possible in the probe head 110 held at the accuracy required to make individual clean connections, and hence the complexity of the supporting equipment.

A need therefore exists for a method and apparatus for testing semiconductor circuits that does not necessarily require the automated test equipment (ATE) to maintain pace with the performance requirements of the semiconductor circuits themselves. Another need exists for a method and apparatus for testing semiconductor circuits that use features and functions provided by the semiconductor circuit itself.

SUMMARY OF THE INVENTION

Generally, a semiconductor circuit is disclosed that contains test hardware or test software (or both) that allows test functions to be executed from the memory of the semiconductor circuit. A remote testing station can communicate with the semiconductor circuit, for example, using a serial interface to issue a command indicating a specific test function that should be implemented. According to one aspect of the invention, the semiconductor circuit independently performs the indicated test and provides the results to the test station.

For an exemplary memory test, the self-test software initially utilizes special test hardware to perform a mass-erase operation on the memory. Thereafter, the self-test software, under the control of an on-chip processor, writes a pattern into the memory by driving the address lines with the appropriate address, the data lines with the value to be written and the control lines with an indication that a write operation should take place. The on-chip processor then reads the applied pattern from each address to confirm that the correct pattern has been stored. The testing technique of the present invention reduces the number of pins that must be contacted by the tester, such as the address pins. In addition, the reduced number of contact points allows a number of semiconductor circuits to be setup and tested in parallel using the same automated test equipment (ATE).

A more complete understanding of the present invention, as well as further features and advantages of the present invention, will be obtained by reference to the following detailed description and drawings.

DETAILED DESCRIPTION

The present invention recognizes that a semiconductor circuit is a self-contained microprocessor having input/output ports and memory. Thus, according to one feature of the present invention, the semiconductor circuit contains test hardware and test software that allows test functions to be executed from the read only memory (ROM) of the semiconductor circuit. The testing technique of the present invention reduces the number of pins that must be contacted by the tester, such as the address pins. The reduced number of contact points allows a number of semiconductor circuits to be setup and tested in parallel using the same automated test equipment (ATE). It is noted that while the present invention is disclosed herein using an exemplary memory test to illustrate the features and functions of the present invention, the present invention can be applied to any well-known tests required for semiconductor circuit, as would be apparent to a person of ordinary skill in the art, including the testing of logic and other components.

Figure 1:
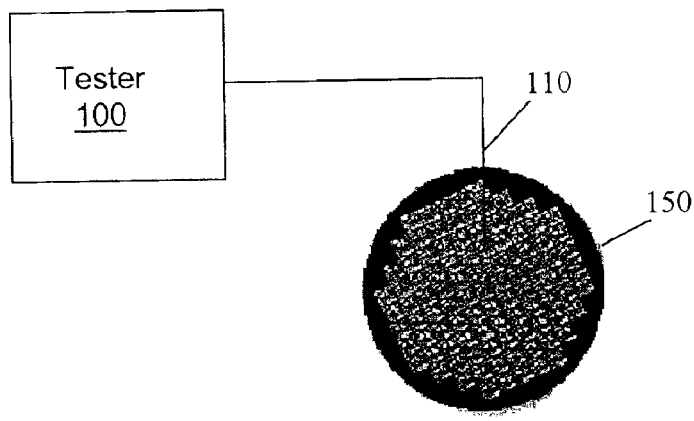
FIG. 1 illustrates a conventional tester that interfaces with each integrated circuit of a wafer to test each semiconductor circuit.
Figure 2A:
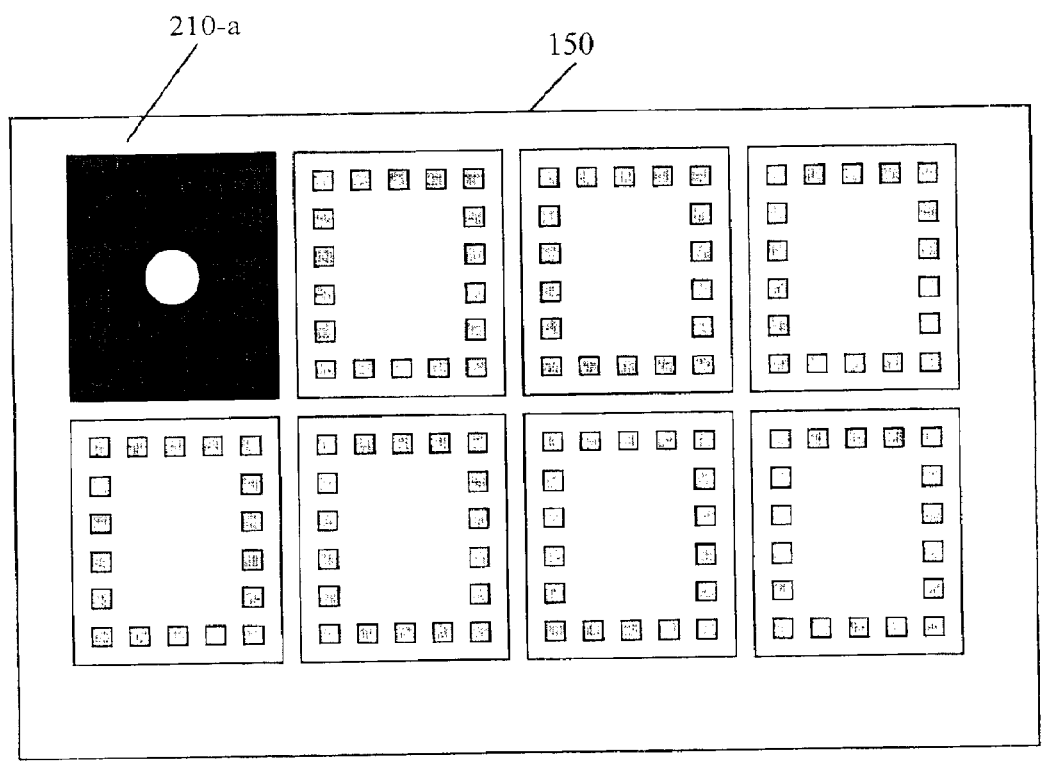
FIGS. 2A and 2B illustrate the serial testing of two individual semiconductor circuits on a wafer by the tester of FIG. 1.
Figure 2B:
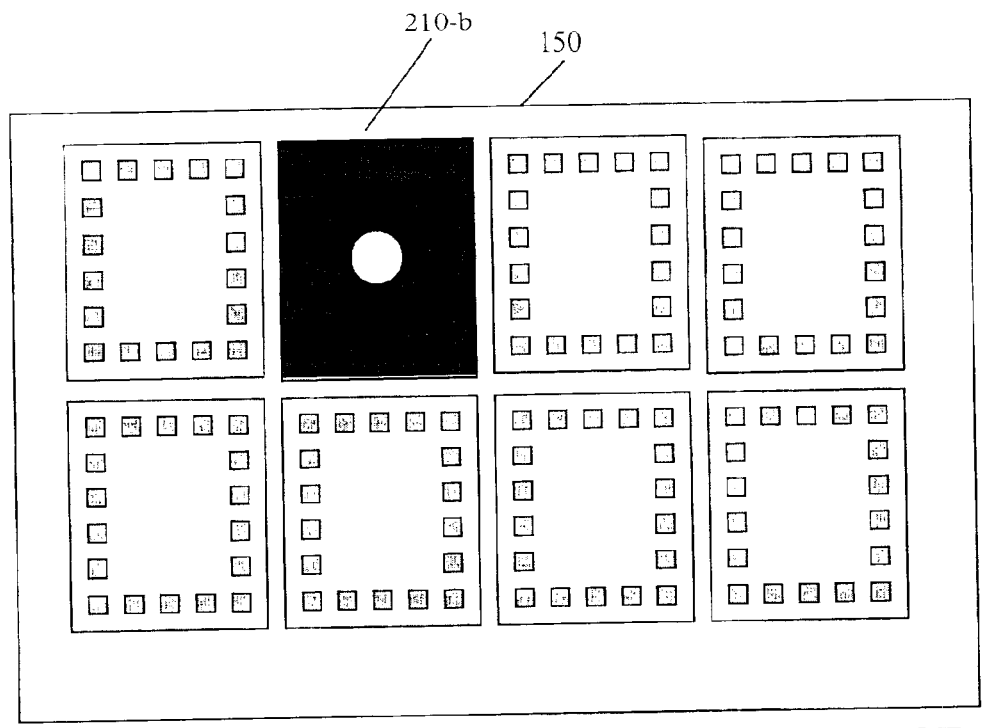
Figure 3:
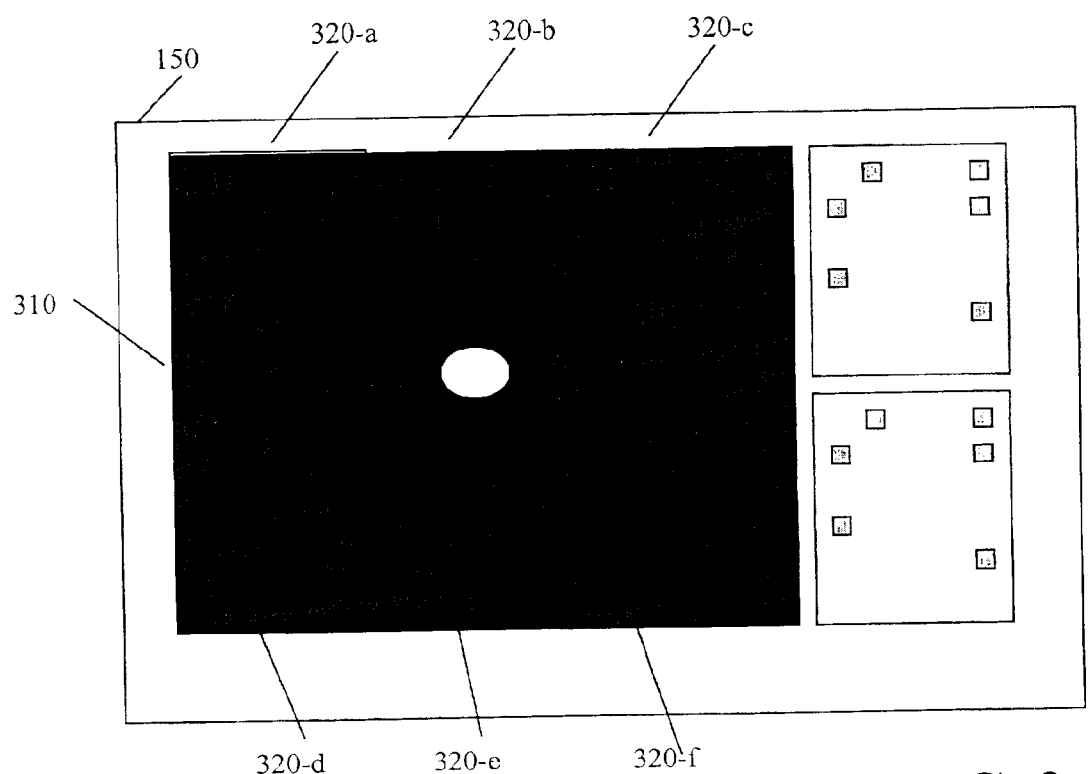
FIG. 3 illustrates a probe head that has been modified in accordance with the present invention to test a plurality of semiconductor circuits in parallel.

FIG. 3 illustrates a probe head 310 that has been modified in accordance with the present invention and is associated with the conventional tester 100 of FIG. 1. The probe head 310 is positioned relative to a number of semiconductor circuits 320-*a* through 320-*f* in a parallel manner, simultaneously performing the same tests on each semiconductor circuit.

Figure 4:
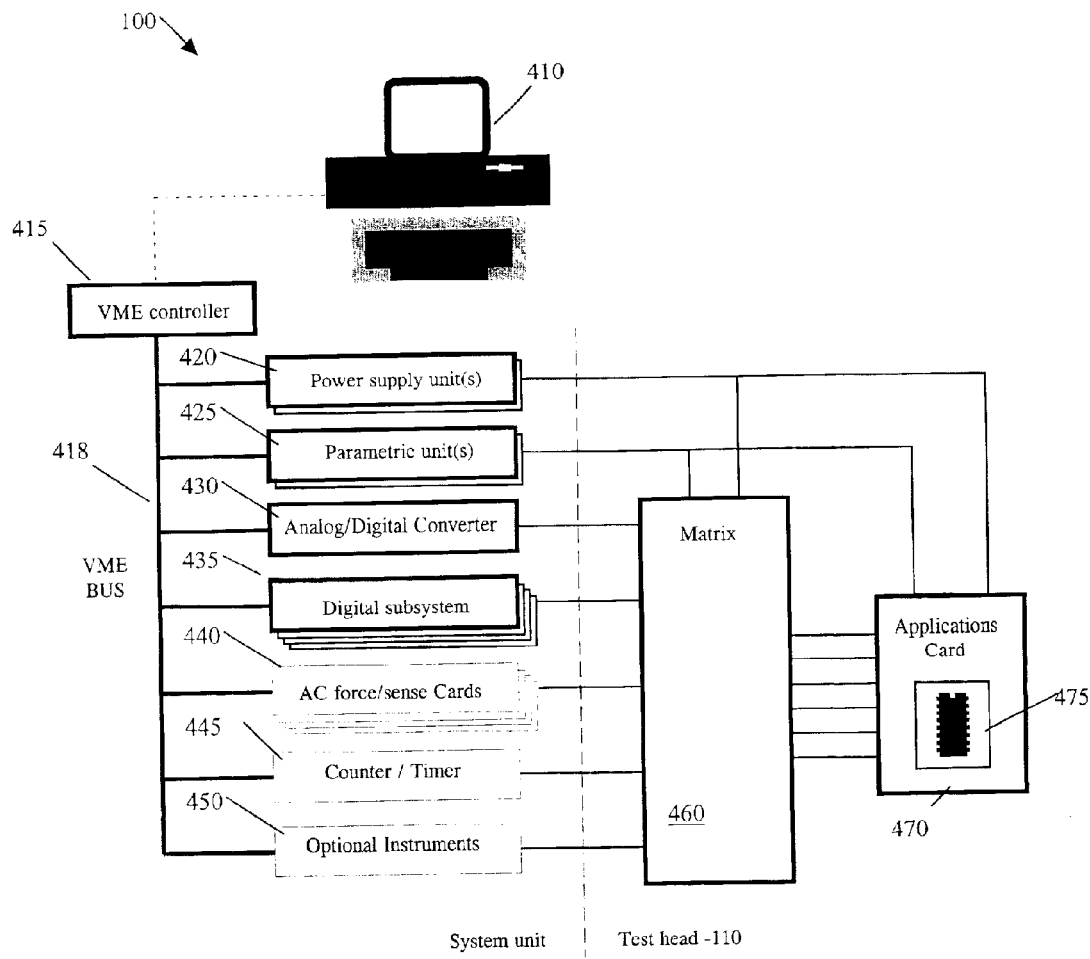
FIG. 4 illustrates the conventional tester of FIG. 1 in further detail.

FIG. 4 illustrates the tester 100 of FIG. 1 in further detail. As shown in FIG. 4, the tester 100 includes a PC controller 410, such as a workstation or personal computer, and a VersaModule Eurocard (VME) controller 415 that controls the operation of a VME bus 418. It is noted that a VME bus is a 32-bit bus developed by Motorola, Signetics, Mostek and Thompson CSF. It is widely used in industrial, commercial and military applications with over 300 manufacturers of VME bus products worldwide. VME64 is an expanded version that provides 64-bit data transfer and addressing. The VME bus 418 connects the PC controller 410 with a number of known test and measuring devices 420 through 450. In the illustrative embodiment, the test and measuring devices include one or more power supply unit(s) 420, parametric unit(s) 425, analog/digital converters 430, digital subsystem 435, AC force/sense cards 440, counter/timer 445 and any other optional instruments 450.

As shown in FIG. 4, any of the various test or measuring devices 420 through 450 that are necessary for a given test can be selectively connected to a semiconductor circuit under test 475 by a switching matrix 460. In the illustrative embodiment shown in FIG. 4, the semiconductor circuit under test 475 is positioned on a header 470. The operation of the conventional tester 100 is well known. For a more detailed discussion of such conventional testers, see, for example, KAT700 System Manuals: KAT System Specification, K.A.Technologies Ltd., Dorset, U.K. (1993), incorporated by reference herein. In a well-known variation, individual wafers can be tested using the tester 100 of FIG. 4 by replacing the applications card 470 with a series of probe needles. As previously indicated, conventional testers, such as the tester 100 shown in FIGS. 1 and 4, perform all the required testing of the semiconductor circuits.

In order to implement testing with the conventional tester 100, shown in FIGS. 1 and 4, the probe head 110 requires a connection for most, if not all, of the pins of the semiconductor circuit being tested. Specifically, a connection is required at least for each power supply, address, data and control pin. In a representative implementation of a standard memory test for a semiconductor circuit having a 4 kilobyte memory 510, shown in FIG. 5, 23 connections are required for address (12), control (3) and data (8). In addition, 5 connections (not shown) are typically required to contact the power supply pins.

A memory test typically includes writing a pattern into the memory to test all cells. Thus, the tester 100 has to drive the address lines with the appropriate address, the data lines with the value to be written and then toggle the control lines to indicate that a write operation should take place. This process is then repeated 4096 times to test the entire memory array 510. In addition, a memory test typically includes reading the applied pattern from each address and comparing the read pattern with the pattern that was initially applied.

Figure 5:
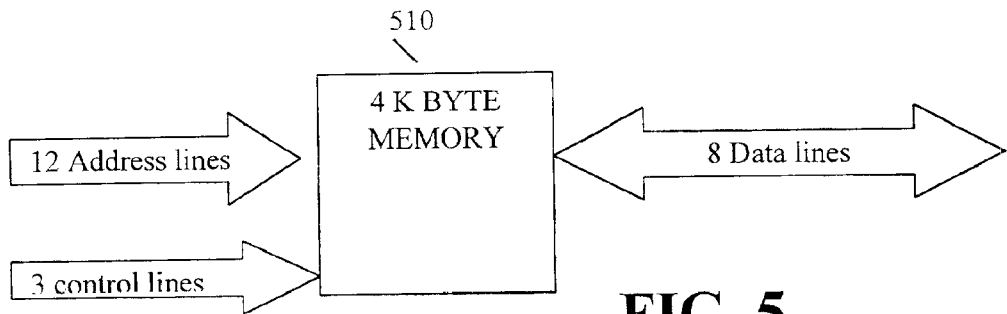
FIG. 5 illustrates the connections that are required to implement a conventional memory test for a semiconductor circuit using the conventional tester of FIG. 1.
Figure 6:
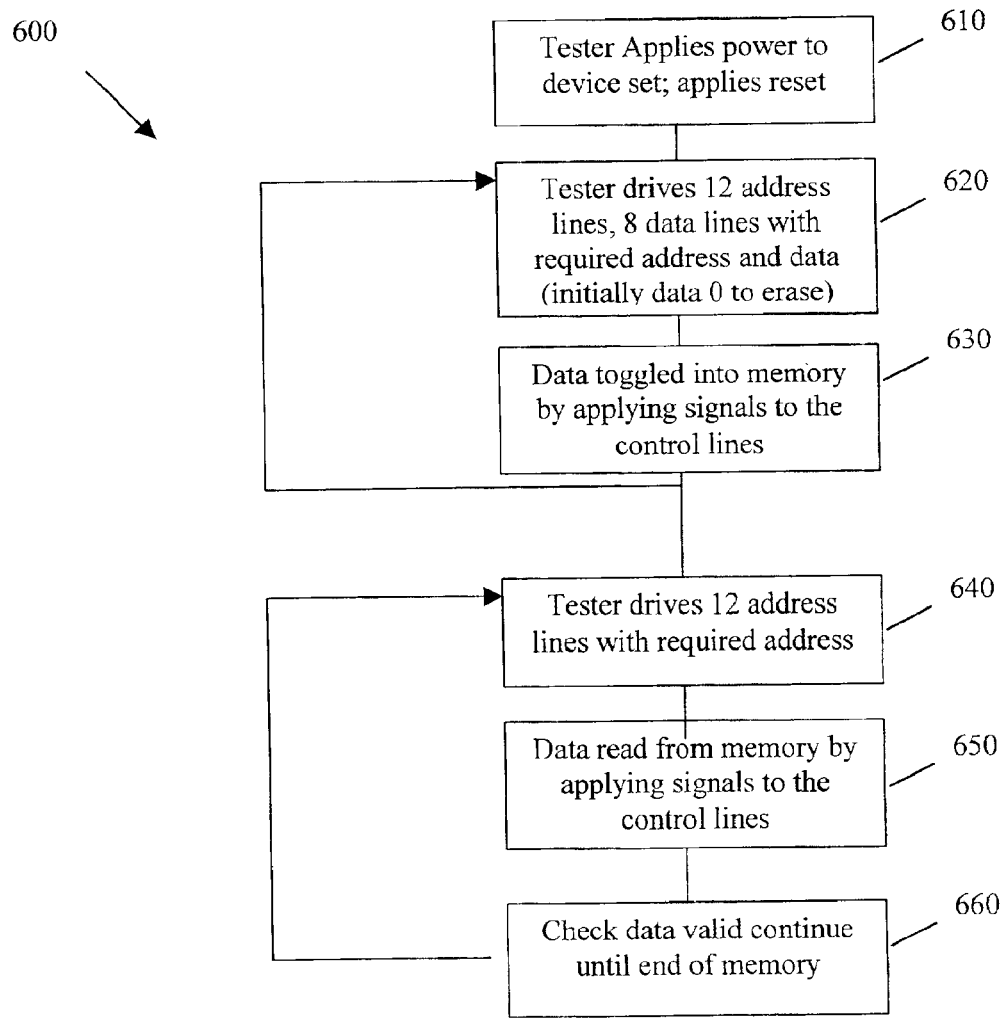
FIG. 6 is a flow chart describing an implementation of the conventional memory test of FIG. 5 from a process point of view.

FIG. 6 is a flow chart describing the implementation of the conventional memory test of FIG. 5 from a process point of view. As shown in FIG. 6, the tester 100 initially applies power to the semiconductor circuit being tested during step 610. The tester 100 then drives the 12 address lines and 8 data lines with the required address and data, respectively, during step 620. It is noted that the data pattern is initially set to zero (0) to erase the memory 510. Thereafter, the data is actually toggled into each cell in the memory 510 by applying the appropriate write signal to the 3 control lines during step 630. This process is then repeated for each cell in the memory 510.

Once the desired pattern has been written to each cell, the tester 100 then drives the 12 address lines with the required address during step 640. Thereafter, the data is read from each cell in the memory 510 by applying the appropriate read signal to the three (3) control lines during step 650. A test is then performed during step 660 to determine if the data that is read from the cell is valid. This process is then repeated for each cell in the memory 510.

Figure 7:
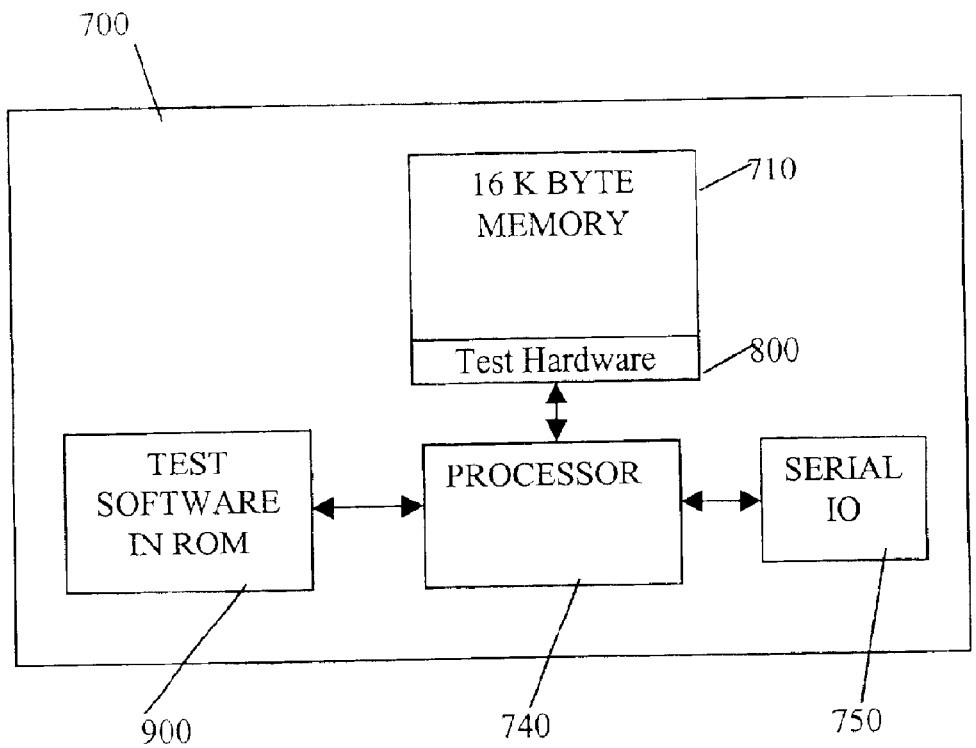
FIG. 7 is a schematic block diagram of a semiconductor circuit incorporating features of the present invention.

As previously indicated, the present invention utilizes test hardware and test software positioned in the semiconductor circuit itself to allow test functions to be executed from the read only memory (ROM) of the semiconductor circuit. FIG. 7 is a schematic block diagram of a semiconductor circuit 700 incorporating features of the present invention. As shown in FIG. 7, the semiconductor circuit 700 includes a representative 16 kilobyte memory 710, a processor 740 and a serial interface 750. In addition, in accordance with the present invention, the semiconductor circuit 700 includes test hardware 800, discussed below in conjunction with FIG.

8, and test software in ROM 900, discussed below in conjunction with FIG. 9.

The tester 100 communicates with the semiconductor circuit 700 using the serial interface 750, in a manner described further below. Generally, the tester 100 issues a command to the semiconductor circuit 700 through the serial interface 750 that indicates a specific test function that should be implemented. As discussed further below in conjunction with FIG. 9, the tester 100 allows the semiconductor circuit 700 to independently perform the test and the tester 100 awaits the results.

The incorporation of any additional logic, or systems on the deliverable silicon that enables the simplification of the actions required by the testing station can be implemented in accordance with the present invention. This can include allowing the on chip processor access to the results of a known logic built-in self-test (BIST), contained on the device being tested. In addition, this allows the diverse testing to be indicated to the controlling tester or operator using any of the assets accessible to software loaded onto the device being tested, such as a serial port, an external pin or a special function register (SFR). For example, the present invention can be employed to test the logic of the on-chip processor 740 shown in FIG. 7 or additional slave processors (not shown), such as cryptographic processors. Generally, the on-chip processor 740 coordinates the application of one or more patterns, and any required additional signals, to the logic device being tested and obtains a result. The result is compared to an expected result to evaluate the validity of the logic operation.

Figure 8:
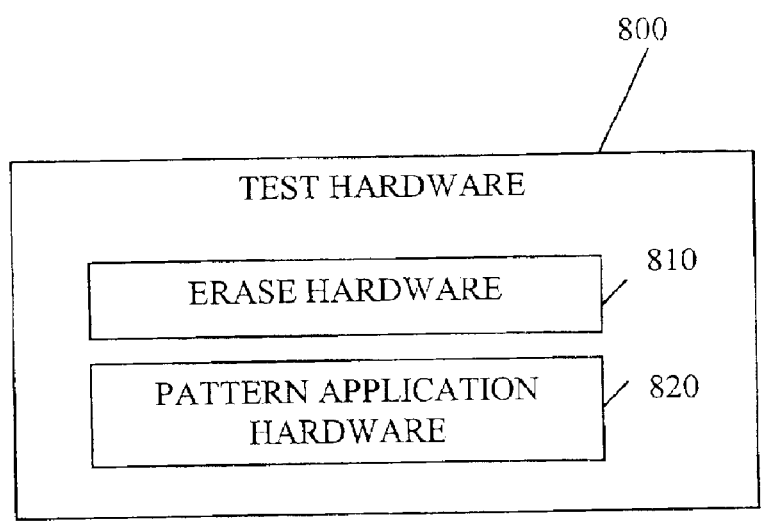
FIG. 8 is a schematic block diagram of a representative implementation the test hardware of FIG. 7.

FIG. 8 is a schematic block diagram of the test hardware 800 shown in FIG. 7, for the illustrative memory test implementation of the present invention. As shown in FIG. 8, the test hardware 800 includes erase hardware 810 for performing a mass-erase operation of the memory 710. In other words, the erase hardware 810 allows the entire memory 710 to be erased in parallel using on chip blocks. In addition, the test hardware 800 includes pattern application hardware 820 for the mass-application of desired patterns to the individual cells of the memory 710. The pattern application hardware 820, for example, may be optimized for applying desired patterns to rows and columns. The erase hardware 810 and pattern application hardware 820 serve to reduce the delay normally associated with such operations, since they are performed directly on the memory 710.

Figure 9:
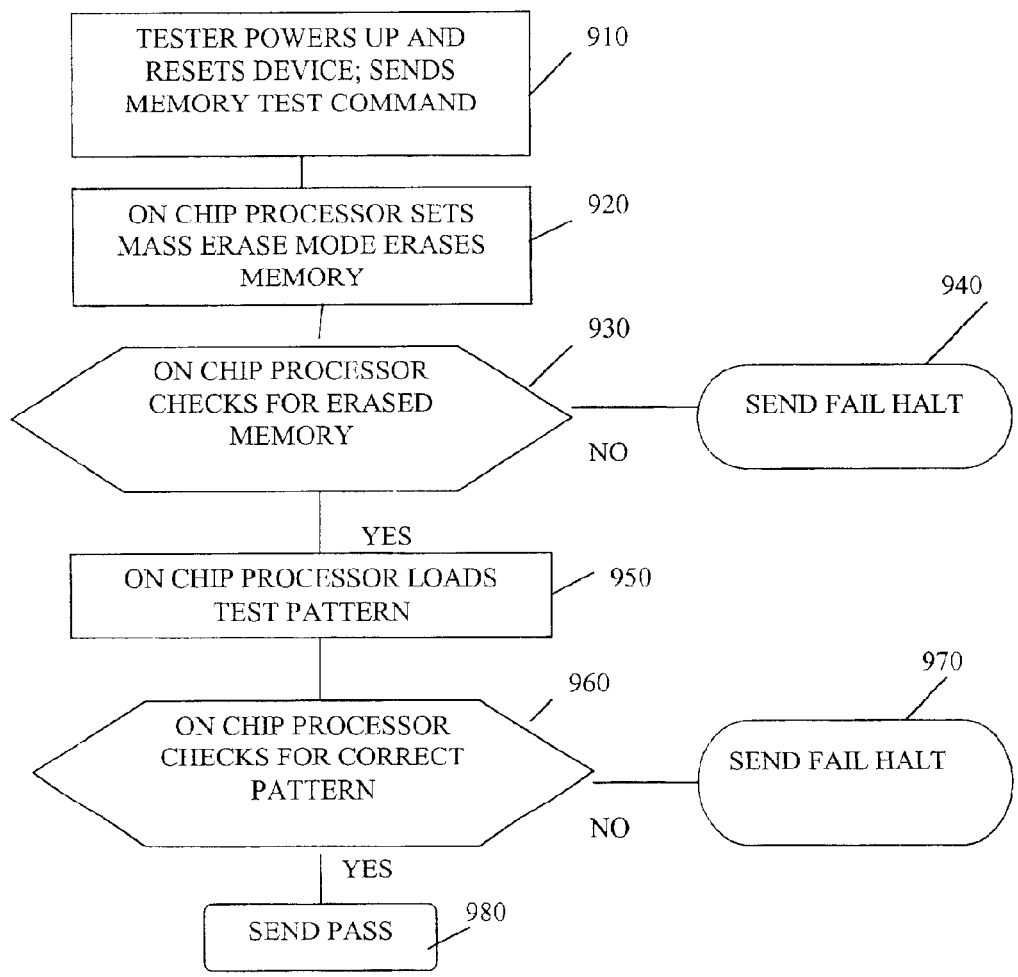
FIG. 9 is a flow chart describing an exemplary implementation of the test software of FIG. 7.

FIG. 9 is a flow chart describing an exemplary implementation 900 of the test software 730 of FIG. 7. As shown in FIG. 9, the tester 100 initially powers up and resets the semiconductor circuit being tested to a known state during step 910, and sends a memory test command to the semiconductor circuit 700 using the serial interface 750. In response to the memory test command, the on-chip processor 740 on the semiconductor circuit 700 sets a mass-erase mode during step 920 using the erase hardware 810 to erase the memory 710.

A test is performed by the processor 740 during step 930 to determine if the memory 710 was properly erased. If it is determined during step 930 that the memory 710 was not properly erased, a fail/halt message is sent to the tester 100 during step 940. If, however, it is determined during step 930 that the memory 710 was properly erased, then the processor 740 loads the desired test pattern during step 950 using the pattern application hardware 820.

A test is performed by the processor 740 during step 960 to determine if the correct patterns appear in the memory 710. If it is determined during step 960 that the correct pattern was not read from the memory 710, a fail/halt message is sent to the tester 100 during step 970. If, however, it is determined during step 960 that the correct pattern was read from the memory 710, then the processor 740 sends a pass message to the tester 100 during step 980.

The process 900 may be repeated with different patterns specifically implemented to test the memory 710 for maximum fault coverage. The present invention simplifies the tasks required by the tester 100, with the algorithms usually performed by the tester 100 being moved onto the processor 740 in the semiconductor circuit 700. While the tester 100 applies any required voltage and clock signals to the semiconductor circuit, the tester 100 only actively communicates on the serial interface 750, issuing commands to initiate a test and thereafter monitoring the interface 750 for pass/fail/no activity.

Representative pseudo-code for performing the algorithm 900 of FIG. 9 is as follows:

Fail=false;
For I=0 to 16K-1
If Address(I)<>ExpectedArrayValue then fail=true;
End
If fail then CommsSend='f' else CommsSend='p'.

It is to be understood that the embodiments and variations shown and described herein are merely illustrative of the principles of this invention and that various modifications may be implemented by those skilled in the art without departing from the scope and spirit of the invention.

I claim:

1. A method of testing a semiconductor circuit having a processor, said method comprising the steps of:
   providing self-test software on said semiconductor circuit;
   initiating the execution of said self-test software by said processor, and wherein said processor executes at least one additional instruction not included in said self-test software; and
   monitoring said semiconductor circuit for a result of said self-test software.

2. The method of claim 1, further comprising the step of applying voltage signals to said semiconductor circuit.

3. The method of claim 2, wherein said voltage signals include a reset signal.

4. The method of claim 2, wherein said voltage signals include an enablement signal.

5. The method of claim 1, further comprising the step of applying clock signals to said semiconductor circuit.

6. The method of claim 1, wherein said initiating step is performed by a remote tester.

7. The method of claim 1, wherein said semiconductor circuit includes a memory, and said test software determines if a predefined pattern is properly applied to said memory.

8. The method of claim 1, wherein said semiconductor circuit includes a logic device, and said test software determines if a logic operation performed on a pattern is valid.

9. A method of testing a semiconductor circuit having a processor, said method comprising the steps of:
   providing test software and test hardware on said semiconductor circuit;
   initiating the execution of said test software by said processor, said test software employing said test hardware to test said semiconductor circuit, and wherein said processor executes at least one additional instruction not included in said self-test software; and
   monitoring said semiconductor circuit for a result of said test.

10. The method of claim 9, further comprising the step of applying signals to said semiconductor circuit.

11. The method of claim 10, wherein said semiconductor circuit includes a memory, and said test software determines if a predefined pattern is properly applied to said memory.

12. The method of claim 10, wherein said semiconductor circuit includes a logic device, and said test software determines if a logic operation performed on a pattern is valid.

13. A method of testing a semiconductor circuit having a processor, said method comprising the steps of:
   receiving a command to initiate self-test software previously stored on said semiconductor circuit;
   executing said self-test software to control the testing of said semiconductor circuit by said processor, and wherein said processor executes at least one additional instruction not included in said self-test software; and
   providing an indication of whether said semiconductor circuit passes said testing.

14. The method of claim 13, further comprising the step of receiving signals from a remote source.

15. The method of claim 13, wherein said semiconductor circuit includes a memory, and said self-test software determines if a predefined pattern is properly applied to said memory.

16. The method of claim 13, wherein said semiconductor circuit includes a logic device, and said self-test software determines if a logic operation performed on a pattern is valid.

17. A semiconductor circuit having a self-test feature, comprising:
   a memory that stores computer-readable code including self-test software; and
   a processor operatively coupled to said memory, said processor configured to implement said computer-readable code including said self-test software, said computer-readable code configured to:
   initiate the execution of said self-test software by said processor, and wherein said processor executes at least one additional instruction not included in said self-test software; and
   monitor said semiconductor circuit for a result of said self-test software.

18. A semiconductor circuit having a self-test feature, comprising:
   a memory that stores computer-readable code including self-test software; test hardware; and
   a processor operatively coupled to said memory, said processor configured to implement said computer-readable code including said self-test software, said computer-readable code configured to:
   initiate the execution of said self-test software, said self-test software employing said test hardware to test said semiconductor circuit by said processor, and wherein said processor executes at least one additional instruction not included in said self-test software; and
   monitor said semiconductor circuit for a result of said test.

* * * * *